United States Patent
Fairchild et al.

(10) Patent No.: US 7,365,273 B2
(45) Date of Patent: Apr. 29, 2008

(54) THERMAL MANAGEMENT OF SURFACE-MOUNT CIRCUIT DEVICES

(75) Inventors: Manuel R. Fairchild, Kokomo, IN (US); David W. Zimmerman, Fishers, IN (US); Suresh K. Chengalva, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 83 days.

(21) Appl. No.: 10/904,904

(22) Filed: Dec. 3, 2004

(65) Prior Publication Data

US 2006/0120058 A1    Jun. 8, 2006

(51) Int. Cl.
*H05K 1/16* (2006.01)
(52) U.S. Cl. .................. 174/260; 174/548; 361/761
(58) Field of Classification Search .......... 174/260, 174/548, 252; 361/709–711, 761–764
See application file for complete search history.

(56) References Cited

U.S. PATENT DOCUMENTS

| | | | |
|---|---|---|---|
| 5,297,006 A * | 3/1994 | Mizukoshi | 361/704 |
| 5,386,339 A | 1/1995 | Polinski, Sr. | 361/719 |
| 5,646,828 A * | 7/1997 | Degani et al. | 361/715 |
| 5,926,371 A * | 7/1999 | Dolbear | 361/704 |
| 6,008,536 A * | 12/1999 | Mertol | 257/704 |
| 6,125,039 A * | 9/2000 | Suzuki | 361/720 |
| 6,487,083 B1 * | 11/2002 | Kwong | 361/761 |
| 6,535,388 B1 * | 3/2003 | Garcia | 361/704 |
| 6,607,942 B1 * | 8/2003 | Tsao et al. | 438/122 |
| 6,680,441 B2 * | 1/2004 | Kondo et al. | 174/260 |
| 6,690,583 B1 | 2/2004 | Bergstedt et al. | 361/763 |
| 6,742,248 B2 * | 6/2004 | Wong et al. | 29/840 |
| 6,933,603 B2 * | 8/2005 | Chen | 257/713 |
| 6,947,286 B2 * | 9/2005 | Belady et al. | 361/719 |
| 7,057,896 B2 * | 6/2006 | Matsuo et al. | 361/704 |
| 2002/0171156 A1 * | 11/2002 | Hashimoto | 257/782 |
| 2003/0075356 A1 * | 4/2003 | Horie | 174/256 |
| 2006/0267184 A1 * | 11/2006 | Kinsman et al. | 257/712 |

* cited by examiner

*Primary Examiner*—Jeremy C Norris
(74) *Attorney, Agent, or Firm*—Jimmy L. Funke

(57) ABSTRACT

A circuit board assembly having a laminate construction of multiple layers, such as a LTCC ceramic substrate, with conductor lines between adjacent pairs of layers. A heat sink is bonded to a first surface of the substrate, and a cavity is defined by and between the heat sink and the substrate such that a base wall of the cavity is defined by one of the layers with conductor lines thereof being present on the base wall. A surface-mount circuit device is received within the cavity, mounted to the base wall, and electrically connected to the conductor lines on the base wall. The device is received within the cavity such that a surface of the device contacts a surface region of the heat sink. The surface of the device is bonded to the surface region of the heat sink to provide a substantially direct thermal path from the device to the heat sink.

9 Claims, 2 Drawing Sheets

THERMAL MANAGEMENT OF SURFACE-MOUNT CIRCUIT DEVICES

BACKGROUND OF THE INVENTION

The present invention generally relates to thermal management of electronic circuit components. More particularly, this invention relates to a circuit board-heat sink structure with an interior cavity containing a surface-mount device thermally coupled to the heat sink to provide enhanced thermal management of the device.

A variety of approaches are known for dissipating heat generated by semiconductor devices, such as integrated circuit (IC) chips. One method is to use a flex circuit laminated or bonded to a heat sink. If the flex circuit material is sufficiently thin, this approach can employ a highly conductive path formed by plated vias through the flex circuit to the heat sink. Another method is to equip a printed circuit board (PCB) with an innerlayer heat sink that is the same size or larger than the PCB to provide a large heat sink for the entire board, and rely on conduction through the PCB material to the heat sink beneath. High-power IC chips, such as power flip chips, are often mounted to substrates formed of a ceramic material such as alumina ($Al_2O_3$) or another ceramic material.

Laminate-type ceramic substrates known as low temperature co-fired ceramics (LTCC) have a number of process-related advantages over conventional ceramic substrates. LTCC substrates are conventionally made up of multiple green tapes containing a mixture of glass and ceramic fillers in an organic binder. The tapes are collated (stacked), laminated, and then fired (co-fired), during which the organic binders within the laminate stack are burned off and the remaining materials form, according to the combined composition, a monolithic ceramic substrate. Though having the above-noted processing advantages, LTCC substrates have relatively low thermal conductivities, typically about 3 W/mK as compared to about 20 W/mK for alumina. Consequently, LTCC substrates have been formed with green tapes containing a metal powder to promote heat dissipation through the substrate. However, a limitation of this approach is that the resulting metal-containing layers of the LTCC substrate are also electrically conductive to some degree. As an example, U.S. Pat. No. 6,690,583 to Bergstedt et al. discloses a thermally-conductive LTCC substrate formed of a metal-containing tape and having surface cavities in which circuit devices are contained. Because of the electrical conductivity of the LTCC substrate, electrical connections must be made to the devices by depositing a dielectric layer over the substrate and the devices within its cavities, and then forming contacts through the dielectric layer to the devices. An alternative approach disclosed in U.S. Pat. No. 5,386,339 to Polinski, Sr., is to form a limited thermally-conductive path through an otherwise conventional (dielectric) LTCC by defining a hole in a stack of dielectric green tapes, and then filling the hole with green tapes containing a thermally conductive material. On firing, the tapes form an LTCC substrate in which a vertical thermally-conductive path is present for conducting heat through the thickness of the substrate.

In other applications where individual layers of an LTCC substrate are to carry conductor patterns, resistors, etc., each ceramic layer is formed by a green tape containing only a mixture of glass and ceramic fillers in a binder. Thick-film conductors, resistors, etc., are printed on individual tapes prior to collating and laminating the tapes. The tapes, along with their conductors and resistors, are then co-fired, during which their respective binders burn off and the remaining materials form, according to their compositions, ceramic (dielectric) and metallic (conductive) materials. Because of the circuit components and their associated interconnect vias within the LTCC substrate, improved thermal conductivity cannot be obtained by the use of metal-containing ceramic layers. A solution to this problem is represented in FIG. 1, and involves forming multiple vias 116 through the thickness of an LTCC substrate 110 to conduct heat in a vertical direction from a die-and-wire type power chip 114. The thermal vias 116 are formed by punching vias in each green tape and then filling the vias with a metal such as silver prior to printing the conductors, resistors, etc. Interconnect vias 118 required to electrically interconnect components on different layers of the LTCC substrate 110 can be formed and filled at the same time as the thermal vias 116. The tapes are then laminated so that the filled vias are aligned to form through-vias, after which the tapes are fired such that the via fill material is co-fired along with conductor and resistor materials printed on surfaces of individual tapes. The entire LTCC substrate 110 (composed of bonded ceramic layers 112) is then bonded with an adhesive 120 to a heat sink 122 so that the thermal vias 116 conduct heat from the chip 114 to the heat sink 122.

While able to promote the conduction of heat away from power devices, thermal vias incur additional processing and material costs, reduce routing density, and can limit design flexibility. Furthermore, thermal vias may be inadequate to achieve suitable thermal management of certain power devices, particularly devices of the flip-chip type. For example, thermal vias alone can be inadequate because the solder bumps of a flip-chip device provide the primary thermal path from the device through the substrate. Compared to the overall die size, the contact area of each bump is relatively small, such that the bumps provide a limited thermal path to the substrate. Furthermore, the number of thermal vias that can be employed to conduct heat to and through the substrate is limited by the number of solder bumps and the configuration of the solder bump pattern. In addition, the use of thermal vias is complicated by the fact that the solder bumps usually require electrical isolation as a result of also providing the electrical connection between the device and the substrate.

In view of the above, further improvements in the construction and processing of LTCC substrates would be desirable to improve thermal management of power IC's, and particularly flip-chip power IC's, while retaining the process-related advantages of LTCC's.

BRIEF SUMMARY OF THE INVENTION

The present invention provides a circuit board assembly having a laminate construction, such as an LTCC ceramic substrate. The substrate is assembled with a heat sink to yield an assembly that provides improved thermal management of one or more power circuit devices mounted to the substrate.

According to a first aspect of the invention, the substrate is made up of a plurality of layers bonded to each other, such as a co-fired substrate made up of a plurality of ceramic layers. Conductor lines are present on at least some of the substrate layers so as to be between adjacent pairs of the substrate layers. A heat sink is bonded to a first surface of the substrate, and a cavity is defined by and between the heat sink and the substrate. For example, the cavity may be defined entirely within the first surface of the substrate, entirely within the opposing surface of the heat sink, or partially in both. If the cavity is formed entirely within the substrate, the surface of the device is preferably at least coplanar with the first surface of the substrate, i.e., the surface of the device is approximately coplanar with or projects beyond the first surface of the substrate. A base wall of the cavity is defined by one of the substrate layers so that conductor lines thereof are present on the base wall. A surface-mount circuit device is received within the cavity, mounted to the cavity base wall, and electrically connected to the conductor lines on the base wall. The device is received within the cavity such that a surface of the device contacts a surface region of the heat sink. The surface of the device is bonded to the surface region of the heat sink to provide a substantially direct thermal path from the device to the heat sink.

According to the invention, the substrate as described above does not require thermal vias that extend through the substrate from the surface-mount circuit device to one of the surfaces of the substrate. Instead, thermal management is achieved by providing a short thermal path directly from the device to the heat sink bonded to the surface of the substrate. The thermal path may include the material with which the heat sink is bonded to the substrate, or another material with better thermal conductivity. By eliminating the requirement for thermal vias, the routing densities of the conductor lines within the substrate are not compromised. Furthermore, if the device is a flip-chip, thermal management is not limited by the number of solder bumps, the configuration of the solder bump pattern, or the requirement for electrical isolation of the solder bumps.

The above advantages of the invention can be achieved without changing any of the fundamental steps of the LTCC process. As such, the processing and structural advantages of LTCC substrates, including the ability to produce conductor lines and other circuit components by photo imaging techniques, can be retained by the invention.

Other objects and advantages of this invention will be better appreciated from the following detailed description.

DETAILED DESCRIPTION OF THE INVENTION

Figure 2:
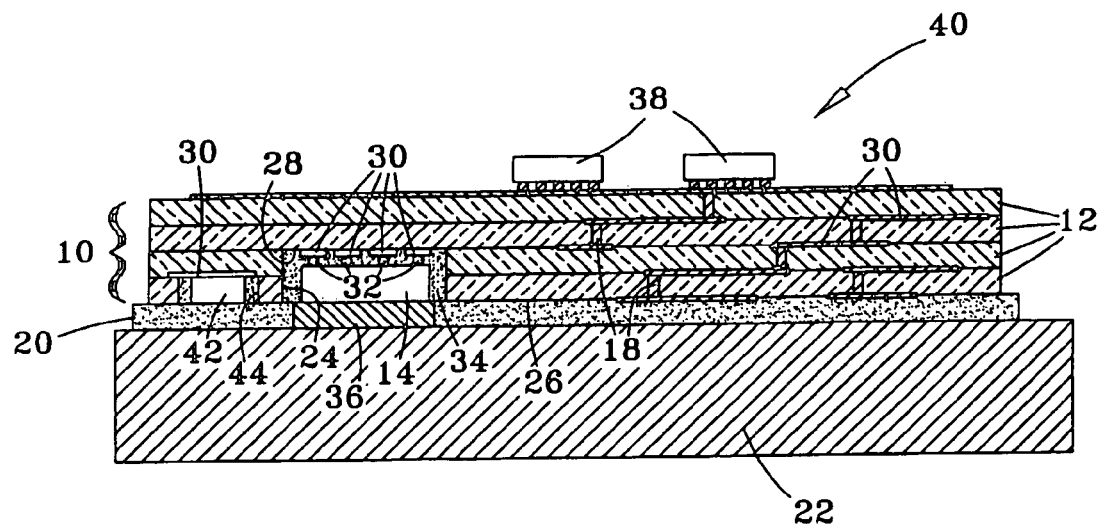
FIGS. 2 and 3 show circuit board assemblies in accordance with three embodiments of the present invention.

FIG. 2 depicts a circuit board assembly 40 in which a power flip chip 14 is mounted on a low-temperature co-fired ceramic (LTCC) substrate 10 in accordance with a first embodiment of the present invention. While a circuit board assembly comprising an LTCC substrate 10 is preferred, the use of other laminate substrates, for example, organic circuit board substrate materials such as FR-4, is also within the scope of this invention.

As an LTCC, the substrate 10 is a monolithic structure made up of multiple ceramic layers 12 bonded to each other, with thick-film conductors 30 located within the substrate 10 between adjacent layers 12. As with known LTCC processes, the substrate 10 is fabricated using individual green tapes on which the thick-film conductor pastes are deposited which, after stacking and firing at a temperature of, for example up to about 900° C., form the ceramic layers 12 and conductors 30, respectively. Other passive circuit components, such as resistors and capacitors, may also be fabricated within the substrate 10 in this manner. Also consistent with LTCC substrates of the past, conductors 30 on adjacent layers 12 are electrically interconnected with conductive interconnect vias 18. The vias 18 are preferably filled through-holes, wherein holes having a diameter of about 3 to about 20 mils (about 75 to about 500 micrometers) are formed in the green tapes and then filled with a suitable conductive material prior to stacking and firing the green tapes. As with prior art LTCC substrates, each of the ceramic layers 12 preferably contains a mixture of electrically-nonconductive materials, typically glass and ceramic particles that, when fired, fuse to form a rigid monolithic structure. A suitable fired composition for the ceramic layers 12 include, by weight, about 30% to about 100% of a glass frit material such as BaO—CaO—$SiO_2$—$Al_2O_3$—$TiO_2$, with the balance being essentially a ceramic material such as $Al_2O_3$. Suitable thicknesses for the individual ceramic layers 12 are about 50 to about 250 micrometers, and a suitable thickness for the substrate 10 is about 250 to about 1500 micrometers.

The flip chip 14 is shown located within a cavity 24 in a surface 26 of the substrate 10. As evident from FIG. 2, the cavity 24 is defined by aligned openings through the two ceramic layers 12 nearest the substrate surface 26. The depth of the cavity 24 is determined by the number of ceramic layers 12 in which the aligned openings were made. The openings can be formed by, for example, punching the green tapes (not shown) used to form the two ceramic layers 12. In this manner, the width, length, and depth of the cavity 24 can be readily sized for the chip 14 to be placed in the cavity 24. In FIG. 2, the non-active backside surface of the chip 14 is substantially coplanar with the surface 26 of the substrate 10.

In the embodiment shown, the bottom of the cavity 24 is formed by a base wall 28 defined by the ceramic layer 12 next to the innermost ceramic layer 12 in which the aligned openings were formed (in the embodiment shown, the ceramic layer 12 that is third closest to the substrate surface 26). Conductors 30 present on the base wall 28 (and therefore between the second and third ceramic layers 12) are exposed within the cavity 24. According to known flip chip procedures, the flip chip 14 is electrically connected and physically attached to the conductors 30 on the base wall 28 with multiple solder bumps 32 located on the active frontside of the chip 14. Also in accordance with known flip chip practices, the flip chip 14 is preferably underfilled with a suitable underfill material 34 to reduce thermal stresses on the solder bumps 32. The preferred underfill material 34 is either an unfilled no-flow or capillary underfill material. If a no-flow material, the underfill material 34 is deposited (dispensed) onto the surface of the cavity base wall 28, the flip chip 14 is then placed through the underfill material 34 and onto the base wall 28 to allow the solder bumps 32 to be attached (reflow soldered) to the conductors 30. If the underfill material 34 is a capillary material, the flip chip 14 is attached to the conductors 30 on the substrate 10 by a reflow solder process, after which the substrate 10 is placed on a heated surface and the capillary underfill material 34 is dispensed around the perimeter of the flip chip 14, all within the confines of the walls of the cavity 24. The heat applied to the substrate 10 causes the underfill material 34 to spread between the flip chip 14 and the substrate 10, preferably to the extent that the underfill material 34 covers the entire surface area of the chip 14 and surrounds solder bumps 32. A secondary dispense of underfill material 34 may be necessary to fill the cavity 24. As seen in FIG. 2, the chip 14 and a capillary-type underfill 34 may substantially fill the cavity 24, such that the cavity 24 is void-free.

According to a preferred aspect of the invention, heat dissipated by the flip chip 14 is conducted away from the flip chip 14 to a heat sink 22 to which the substrate 10 is bonded with an adhesive 20. A suitable bondline thickness for the adhesive 20 is in a range of about 75 to about 375 micrometers. Generally, the bondline thickness of the adhesive 20 between the chip 14 and heat sink 22 is dependent on the ratio of the contact area of the chip 14 with the adhesive 22 to the contact area between the substrate 10 and the adhesive 20.

As depicted in FIG. 2, the backside of the chip 14 is directly attached to the heat sink 22 with a solder material 36, such that the thermal path is directly between the chip 14 and heat sink 22 through the solder material 36. For use with the solder material 36, preferred materials for the heat sink 22 include plated or unplated aluminum and its alloys, copper and its alloys, plated steel, or a composite such as Cu/Mo/Cu, though other materials could be used. To prevent reflowing the solder bumps 32 on the frontside of the chip 14 during soldering of the chip 14 to the heat sink 22, the solder material 36 preferably has a lower melting temperature than the solder bumps 32.

As an alternative, the solder material 36 could be eliminated, such that heat dissipated by the flip chip 14 is conducted to the heat sink 22 solely through the adhesive 20. In such an embodiment, the heat sink 22 is not required to be formed of a solderable material. However, the thermal conductivity of the adhesive 20 becomes of greater importance. Heat transfer through the adhesive 20 can be promoted by forming the adhesive 20 of an adhesive matrix material (e.g., an epoxy) that contains a dispersion of metal and/or ceramic particles. Alternatively or in addition, heat transfer through the adhesive 20 can be promoted by minimizing the thickness of the adhesive 20 through which heat is conducted. However, if the solder material 36 is not employed, a sufficient adhesive bondline thickness must exist to ensure a reliable bond between the chip 14 and heat sink 22. In the absence of the solder material 36, a suitable bondline thickness for the adhesive 20 between the chip 14 and heat sink 22 is believed to be about 25 to about 125 micrometers.

In addition to the power flip chip 14, other circuit devices are shown as being mounted to the substrate 10. For example, various passive and active devices 38 are shown attached to the surface of the substrate 10 opposite the heat sink 22. FIG. 2 also depicts a passive device 42 within a second cavity 44 formed in the surface 26 of the substrate 10. The cavity 44 can be fabricated in essentially the same manner as the cavity 24 for the flip chip 14, with electrical connection of the device 42 being through conductors 30 between the ceramic layers 12 nearest the heat sink 22. A surface of the device 42 is substantially coplanar with the surface 26 of the substrate 10, providing a thermal path from the device 42 to the heat sink 22 through the adhesive 20.

In view of the above, the embodiment of FIG. 2 does not rely on thermal vias that extend through the substrate 10 to conduct heat from the chip 14 to the heat sink 22. Instead, the layer of solder material 36 provides a direct path for heat transfer between the chip 14 and the heat sink 22, such that the relatively poor heat transfer characteristics of the substrate 10 do not pose a limitation to the thermal management of the chip 14.

Figure 3:
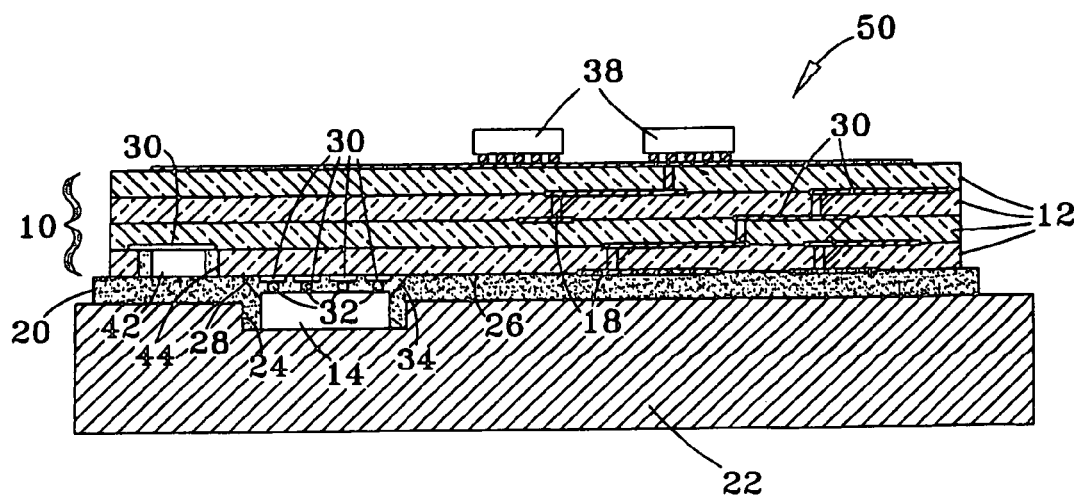

FIG. 3 depicts a circuit board assembly 50 in accordance with a second embodiment of the invention in which, for convenience, corresponding components are identified with the same reference numbers as those used in FIG. 2. As such, a power flip chip 14 is mounted on an LTCC substrate 10 made up of multiple ceramic layers 12. The embodiment of FIG. 3 primarily differs from FIG. 2 by its location of the cavity 24 within the heat sink 22 instead of the substrate 10. Multiple solder bumps 32 on the active frontside of the chip 14 electrically and physically attach the chip 14 to conductors 30 on the surface 26 of the substrate 10. The non-active backside of the chip 14 may be bonded to the bottom of the cavity 24 with solder (not shown) or a portion of the adhesive 20 that bonds the heat sink 22 to the substrate 10. An advantage of this embodiment is that heat transfer occurs vertically from the chip 14 to the heat sink 22, as well as laterally into the heat sink 22 through the walls of the cavity 24.

Figure 1:
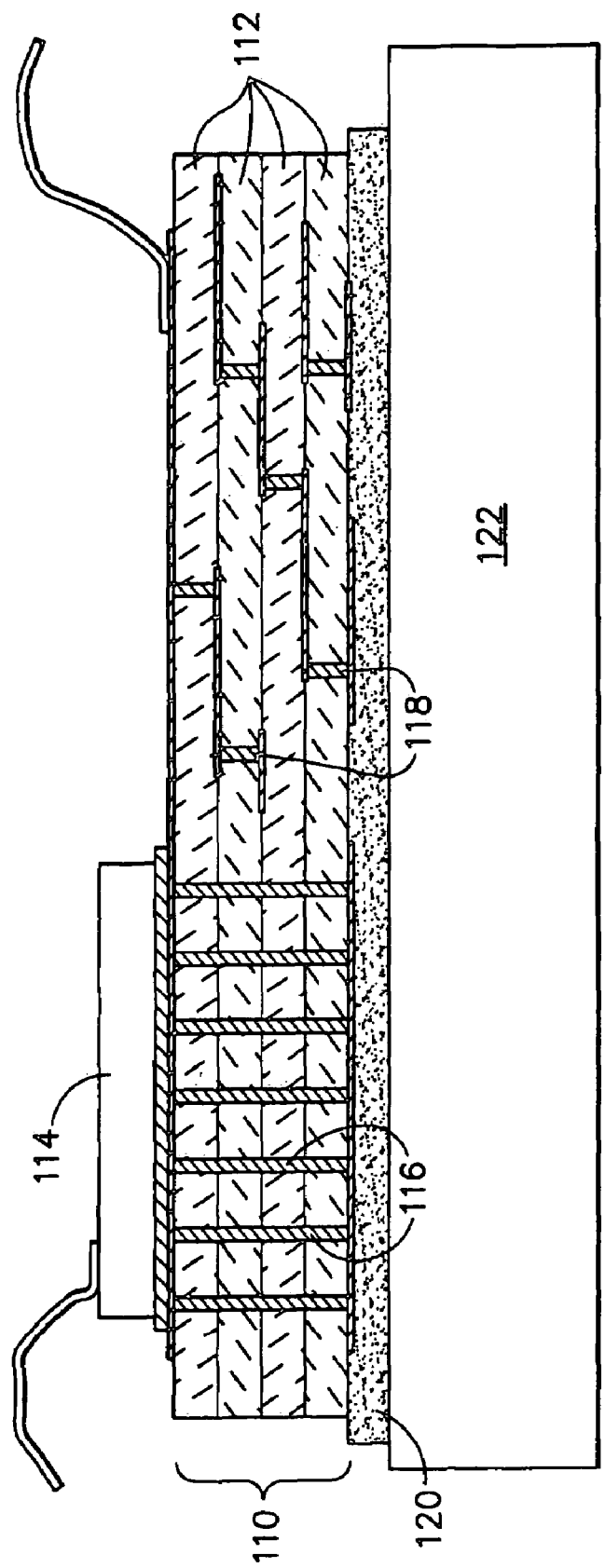
FIG. 1 shows an LTCC substrate with thermal vias in accordance with the prior art.

With each of the embodiments represented in FIGS. 2 and 3, a desired effect is that the primary thermal path for the power flip chip 14 is through a solder material 36 or a thermally-conductive adhesive 20, and not through the LTCC substrate 10 on which the chip 14 is mounted. As such, the relatively poor heat transfer characteristics of the substrate 10 do not pose a limitation to the thermal management of the chip 14, and the maximum steady-state and transient temperatures of the chip 14 can be significantly reduced in comparison to prior art LTCC substrates that rely on thermal vias (FIG. 1).

The process of making the substrate 10 can be achieved without changing any of the fundamental steps of a conventional LTCC process. As such, the process of this invention will not be described in any detail. In a suitable process consistent with LTCC processes, individual green tapes are blanked from a green ceramic tape roll formulated to contain a binder along with the appropriate glass frit, ceramic, etc., so that when fired the tapes will yield the desired composition for the ceramic layers 12 of the substrate 10. Following blanking, the green tapes undergo via punching to yield through-hole vias for the interconnect vias 18. At this time, the openings can also be formed that will define the cavities 24 and 44 in the substrate 10 depicted in FIG. 2. The through-hole vias are then filled with a suitable conductive paste, which on firing will yield the interconnect vias 18. Thereafter, conductive paste is printed on the green tapes to form, on firing, the conductors 30. Suitable pastes can also be deposited at this time to form any thick-film resistors, etc., required for the circuitry of the substrate 10. Conventional LTCC processing can then be performed, including collating and laminating the tapes, so that the tapes are superimposed, i.e., the edges of the tapes are aligned. The resulting green substrate is then co-fired, during which the binders within the tapes and their components (e.g., vias 18, conductors 30, etc.) are burned off and the remaining inorganic components are fused.

After conventional post-printing and post-firing process steps such as resistor trimming and electrical testing are carried out, the flip chip 14 is reflow soldered to the substrate 10 and the heat sink 22 is bonded to the substrate 10 with the adhesive 20. If the cavity 24 is located in the substrate 10 (FIG. 2), the flip chip 14 is placed in the cavity 24 (after dispensing the underfill material 34 if a no-flow underfill is used, or before dispensing the underfill material 34 if a capillary-type underfill is used) so that its solder bumps 32 register with their respective conductors 30 on the cavity base wall 28. If the cavity 24 is located in the heat sink 22 (FIG. 3), the flip chip 14 is placed on the substrate surface 26 so that its solder bumps 32 register with their respective conductors 30 on the substrate surface 26. Thereafter, the chip 14 and any other surface-mount devices 38 are reflow soldered to their respective conductors 30, followed by bonding of the heat sink 22 to the substrate 10.

While the invention has been described in terms of particular embodiments, it is apparent that other forms could be adopted by one skilled in the art. Accordingly, the scope of the invention is to be limited only by the following claims.

What is claimed is:

1. A circuit board assembly comprising:

a low-temperature co-fired ceramic substrate comprising a top layer, a bottom layer and at least one intermediate layer, each of said layers bonded directly to any adjacent layers, and conductor lines carried on at least one of said intermediate layers internally within said substrate, said bottom layer defining a first, outer surface of said substrate;

a heat sink having an upper surface bonded to the first, outer surface of said substrate, said substrate and heat sink cooperating to define a closed cavity therebetween, said cavity extending from the upper surface of said heat sink, through the bottom layer of said substrate, and terminating at an intermediate layer of said substrate, exposing conductor lines carried on said intermediate layer;

a surface-mount circuit device enclosed within said cavity, said circuit device defining an active surface facing said intermediate layer and including solder bumps in-circuit with said exposed conductor lines, said circuit device defining a passive surface bonded to said heat sink to provide a thermal path from the device to the heat sink;

underfill material which, in combination with said circuit device, entirely fills said closed cavity;

a second closed cavity defined by said substrate and heat sink and extending through the bottom layer of the substrate, the second cavity exposing conductor lines carried on an intermediate layer; and a passive electronic component mounted within the second cavity so as to be received entirely within the second cavity, the passive electronic component being electrically connected to the exposed conductor lines within the second cavity.

2. A circuit board assembly according to claim 1, further comprising solder material that directly bonds the passive surface of the device to the heat sink, the thermal path from the device to the heat sink being through the solder material.

3. A circuit board assembly according to claim 1, wherein the thermal path from the device to the heat sink is through an adhesive bonding material that bonds the heat sink.

4. A circuit board assembly according to claim 3, wherein the adhesive bonding material comprises an adhesive matrix containing particles that are more thermally conductive than the adhesive matrix.

5. A circuit board assembly according to claim 1, wherein the device is a flip chip device electrically connected to the exposed conductor lines within the cavity with a plurality of solder connections.

6. A circuit board assembly according to claim 1, further comprising a circuit device mounted to a second outer surface of the substrate opposite the first surface, said second outer surface defined by said top layer.

7. A circuit board assembly according to claim 1, wherein the substrate does not contain any thermal vias extending through the substrate from the device to the first surface.

8. A circuit board assembly according to claim 1, wherein the passive electronic component has a surface substantially coplanar with the first surface of the substrate.

9. A circuit board assembly according to claim 8, wherein the heat sink is bonded with a bonding material to the surface of the passive electronic component to provide a thermal path from the passive electronic component to the heat sink through the bonding material.

* * * * *